(12) United States Patent
Chung et al.

(10) Patent No.: US 9,134,360 B2
(45) Date of Patent: Sep. 15, 2015

(54) METHOD AND APPARATUS FOR FEEDBACK-BASED RESISTANCE CALIBRATION

(75) Inventors: Tao Wen Chung, San Jose, CA (US);
Chan-Hong Chern, Palo Alto, CA (US);
Ming-Chieh Huang, San Jose, CA (US);
Chih-Chang Lin, San Jose, CA (US);
Yuwen Swei, Fremont, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 279 days.

(21) Appl. No.: 13/547,101

(22) Filed: Jul. 12, 2012

(65) Prior Publication Data
US 2014/0015611 A1   Jan. 16, 2014

(51) Int. Cl.
*H03L 5/00*   (2006.01)
*G01R 31/26*  (2014.01)

(52) U.S. Cl.
CPC ................................. *G01R 31/2621* (2013.01)

(58) Field of Classification Search
CPC ... H03H 11/245; H03H 11/24; H03K 17/693; H03G 1/0088; H03G 1/007

USPC .......... 327/306, 308, 344, 553, 558; 323/367, 323/353, 282, 284; 361/56
See application file for complete search history.

(56) References Cited

U.S. PATENT DOCUMENTS

| 5,919,253 | A  | * | 7/1999 | Schneider ..................... 710/302 |
| 7,868,361 | B2 |   | 1/2011 | Cheng et al. |
| 7,876,139 | B2 | * | 1/2011 | Oh ................................ 327/158 |
| 2003/0102901 | A1 | * | 6/2003 | Ooishi .......................... 327/512 |

OTHER PUBLICATIONS

Design of Analog CMOS Integrated Circuits, Behzad Razavi, Copyright 2001 by The McGraw-Hill Companies, Inc.

* cited by examiner

*Primary Examiner* — Lincoln Donovan
*Assistant Examiner* — Diana J Cheng
(74) *Attorney, Agent, or Firm* — Duane Morris LLP

(57) ABSTRACT

A circuit has a first circuit module including a first resistor and first and second transistors coupled in parallel with the first resistor. The first resistor and the first and second transistors are coupled together at a first node. An equivalent resistance across the first circuit module increases as a voltage of the first node is increased from a first voltage to a second voltage, and the equivalent resistance across the first circuit module decreases as the voltage of the first node is increased from the second voltage to a third voltage.

19 Claims, 4 Drawing Sheets

METHOD AND APPARATUS FOR FEEDBACK-BASED RESISTANCE CALIBRATION

BACKGROUND

As increasingly advanced semiconductor fabrication processes are used these days, precise tuning of various circuit characteristics is an important consideration. Resistance variation is a challenging issue that can make it difficult to design circuitry that meets various performance requirements. After tapeout for a 28 nm fabrication process, variation of up to 30% in resistance has been observed. Such resistance variation is sought to be calibrated to ensure proper circuit performance.

One prior digital approach for calibrating a resistance involved selectively enabling or disabling various combinations of switches coupled to a resistor network. A disadvantage with that approach is that the use of numerous switches necessitates a large circuit area and a large number of external control pins, increasing circuit complexity and cost.

BRIEF DESCRIPTION OF THE DRAWINGS

The following will be apparent from elements of the figures, which are provided for illustrative purposes and are not necessarily to scale.

DETAILED DESCRIPTION

Figure 1:
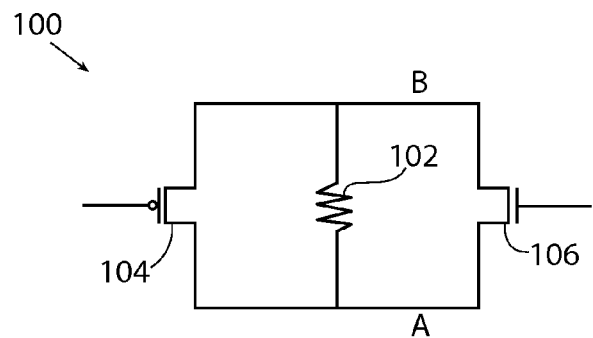
FIG. 1 is a circuit diagram in accordance with some embodiments of the present disclosure.

This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

In the description, relative terms such as "lower," "upper," "horizontal," "vertical,", "above," "below," "up," "down," "top" and "bottom" as well as derivative thereof (e.g., "horizontally," "vertically," "downwardly," "upwardly," etc.) should be construed to refer to the orientation as then described or as shown in the drawing under discussion. These relative terms are for convenience of description and do not require that the apparatus be constructed or operated in a particular orientation. The term "around," when used in the context of a first element being positioned around a second element, does not require that the first element be directly bordering the second element.

Figure 2:
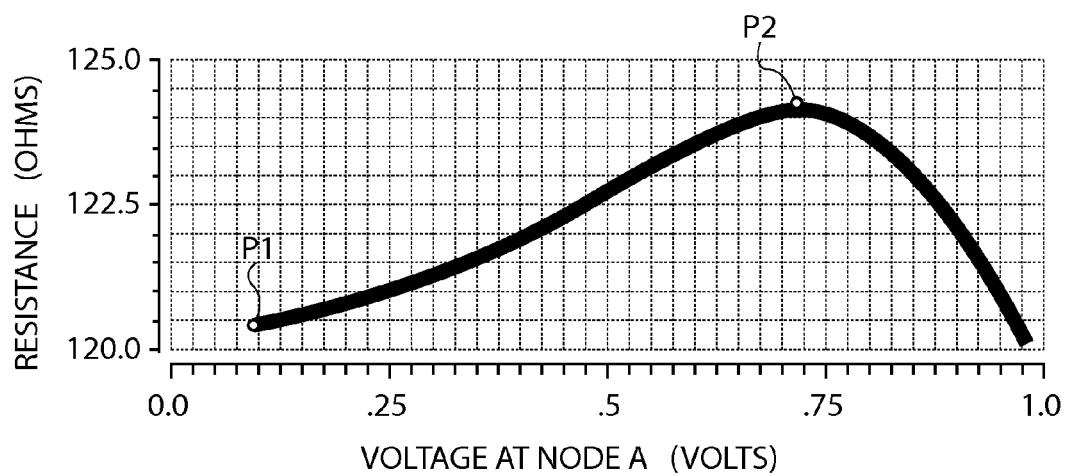
FIG. 2 is a plot of resistance versus voltage in accordance with some embodiments.

FIG. 1 is a diagram of a circuit 100 in accordance with some embodiments of the present disclosure. A resistor 102 to be calibrated exhibits resistance variation. A PMOS transistor 104 and an NMOS transistor 106 are coupled in parallel with resistor 102 as shown in FIG. 1. Transistor 104 has a source terminal coupled to node B and a drain terminal coupled to node A. Transistor 106 has a source terminal coupled to node A and a drain terminal coupled to node B. The equivalent resistance across transistors 104, 106 and resistor 102 varies as a function of the voltage at node A, as shown in FIG. 2. The particular resistance and voltage values in FIG. 2 are merely one example. FIG. 2 shows a relationship in which resistance increases as the node A voltage is increased from a first voltage (e.g., about 0.1 V) to a second voltage (e.g., about 0.7 V), and decreases as the node A voltage is increased from the second voltage to a third voltage (e.g., about 1 V).

The voltage-resistance relationship in FIG. 2 may be understood as follows. In analog CMOS design, a MOSFET (metal oxide semiconductor field effect transistor) can operate as a variable resistor whose resistance value is controlled by an overdrive voltage (difference between gate-source voltage and threshold voltage). Specifically, in the transistor operating region known as the deep triode region, where the drain-source voltage is relatively low, MOSFETs exhibit drain current $I_D$ that varies linearly as a function of drain-source voltage $V_{DS}$. Linearity in the deep triode region is described in the literature at, e.g., Razavi, "Design of Analog CMOS Integrated Circuits," chapter 2 (2005) the entirety of which is herein incorporated by reference. In the deep triode region, the gate-source voltage determines the slope of the line passing through the origin in the voltage-current ($V_{DS}$–$I_D$) plane. Referring to FIGS. 1 and 2, for a given gate voltage of NMOS transistor 106, when the voltage at node A (coupled to the source of transistor 106) is relatively low (e.g., nearly zero in the plot of FIG. 2), the gate-source voltage of transistor 106 is relatively high, and the NMOS transistor is turned on, conducting current between its drain and source terminals. For example, at point P1 on the operating curve of FIG. 2, voltage at node A is about 0.102 V and equivalent resistance is about 120.5 ohms. With the transistor 106 in the on state, the resistance across transistor 106 is reduced, and the equivalent resistance plotted in FIG. 2 is reduced. When the voltage at node A is relatively high (e.g., close to 1 V in the example of FIG. 2), the NMOS transistor 106 turns off, i.e., transistor 106 is in a non-current conducting state. The PMOS transistor 104 turns on in this voltage scenario, again reducing equivalent resistance.

Thus, when voltage at node A is either relatively low (e.g., about 0 V) or relatively high (e.g., close to the voltage at node B), equivalent resistance is reduced. In this manner, resistance is maintained in a relatively narrow range of values over a wide range of currents, and calibration of resistance is achieved. In some embodiments, maximum resistance occurs at point P2 of FIG. 2, corresponding to a voltage at node A of about 0.719 V and an equivalent resistance of about 124.1 ohms, and resistance variation of only about 3.0% is achieved along the operating curve in some examples. If NMOS transistor 106 were not included in the calibration circuit, then resistance would only be reduced when the PMOS transistor 104 is on, which occurs when the voltage at node A is relatively high. Without the NMOS transistor 106, relatively low voltages at node A would result in high equivalent resistance, and the plot of resistance versus node A voltage would be strictly decreasing as voltage increases, rather than increasing and then decreasing as in FIG. 2. Thus, inclusion of NMOS transistor 106 along with PMOS transistor 104 advantageously controls resistance at both low and high node A voltages.

Figure 3:
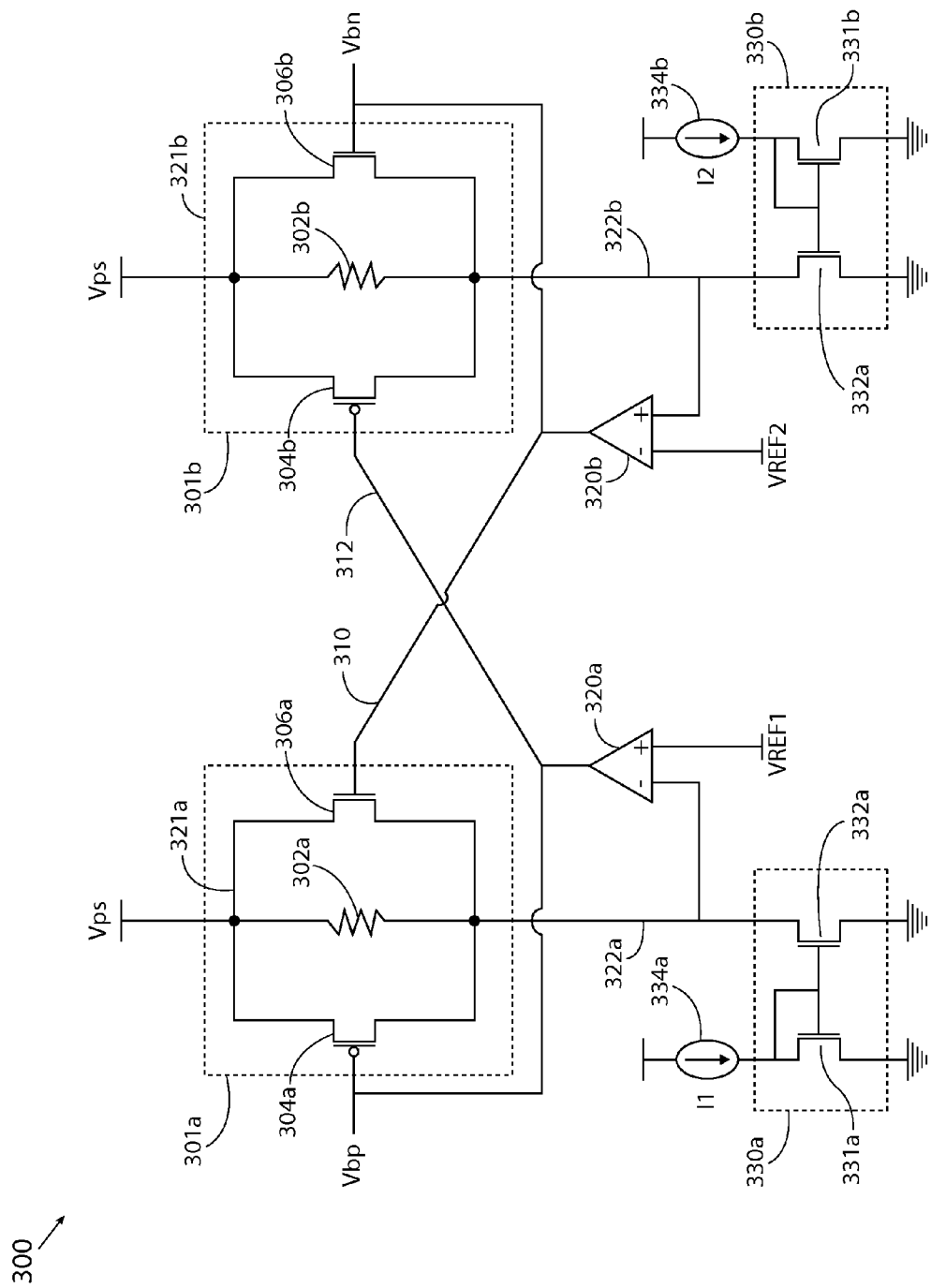
FIG. 3 is a schematic diagram of a circuit for determining gate voltages for resistance calibration in accordance with some embodiments.

In some embodiments, the gate voltages of transistors 104 and 106 are set using a double decision feedback loop. In FIG. 3, a circuit 300 includes a first circuit module 301a, which has a resistor 302a and transistors 304a and 306a coupled in parallel, and a circuit module 301b, which has a resistor 302b and transistors 304b and 306b coupled in parallel. The first and second circuit modules 301a, 301b are tied to a power supply voltage $V_{PS}$ (e.g., 1 V) at nodes 321a and 321b, respectively. The NMOS transistors 306a and 306b have respective gates coupled to node 310, and the PMOS transistors 304a and 304b have respective gates coupled to node 312.

The voltages of nodes 310 and 312 (denoted $V_{bn}$ and $V_{bp}$, respectively) are decided using negative feedback from operational amplifiers 320a and 320b, which function as comparators to compare a signal from circuit module 301a or 301b to a reference voltage. Amplifier 320a has an inverting input terminal coupled to node 322a which serves a similar role as node A in FIG. 1. Amplifier 320a has a noninverting input terminal tied to a reference voltage $V_{REF1}$. Amplifier 320b has an inverting input terminal coupled to node 322b and an noninverting terminal tied to a reference voltage $V_{REF2}$. In some embodiments, $V_{REF1}$ is less than $V_{REF2}$, e.g., $V_{REF1}$=0.2 V and $V_{REF2}$=0.8 V. Node 322a is coupled to a current mirror 330a, including transistors 331a and 332b. A current source 334a provides current $I_1$. Similarly, node 322b is coupled to current mirror 330b, including transistors 331b and 332b, and a current source 334b provides current $I_2$. In one example, $I_1$=8 mA and $I_2$=2 mA. Due to high gain of amplifier 320a, the voltage at node 312 (output of the amplifier 320a) is forced to 0.2 V. The equivalent resistance across transistors 304a and 306a and resistor 302a is (1 V−0.2 V)/0.008 A=100 ohms. Similarly, due to amplifier 320b, the voltage at node 310 is forced to 0.8 V, and the equivalent resistance across transistors 304b and 306b and resistor 302b is (1 V−0.8V)/0.002 A=100 ohms.

Thus, $(V_{PS}-V_{REF1})/I_1=(V_{PS}-V_{REF2})/I_2$, and resistance is calibrated in this example to 100 ohms (a desired resistance) at each circuit module 301a, 301b. In other examples, different voltages and currents satisfying the foregoing equation may be used to calibrate various resistance values. The reason for using two circuit modules 301a, 301b and two amplifiers 320a, 320b is as follows. The PMOS and NMOS devices of each module 301a, 301b interfere with each other, so an optimal PMOS gate voltage cannot simply be first determined before independently determining an optimal NMOS gate voltage. Rather, the two feedback loops provided by the respective amplifiers 320a, 320b converge to provide the final solution, thus deciding gate voltages $V_{bp}$ and $V_{bn}$ for the PMOS and NMOS transistors, respectively.

Figure 4:
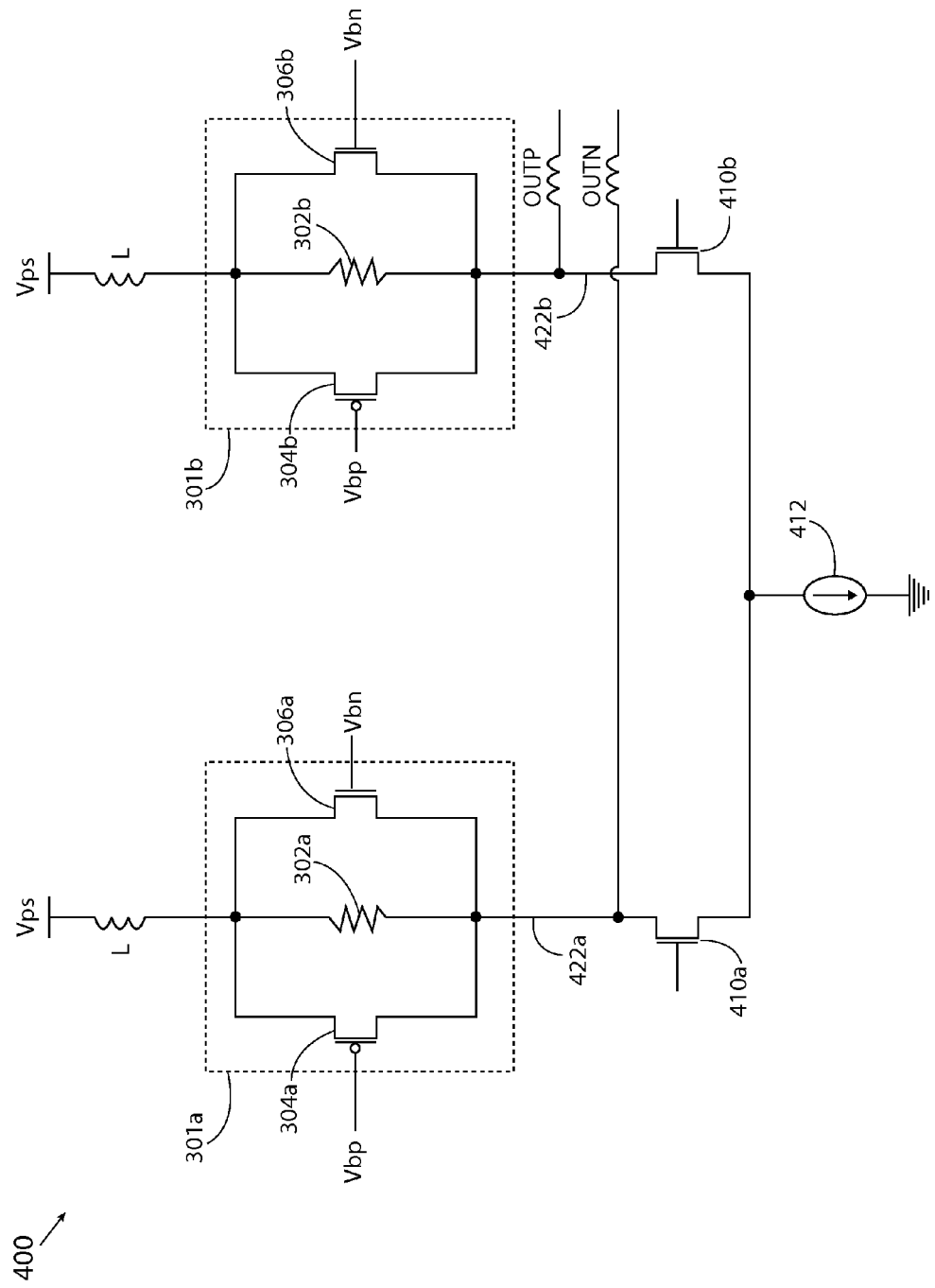
FIG. 4 is a circuit diagram in accordance with some embodiments.

FIG. 4 is a circuit diagram of an amplifier for which loading is applied in accordance with some embodiments of the present disclosure. After the gate voltages $V_{bp}$ and $V_{bn}$ have been determined using the double decision feedback circuit of FIG. 3, circuit modules 301a and 301b providing calibrated resistance may be configured with an inductive load L and output loads OUTP, OUTN as shown in FIG. 4. The inductive loads enable wider 3 dB bandwidth through inductive peaking for broadband amplifier design. NMOS transistors 410a and 410b have their source terminals coupled to one another and to current source 412, and have their drain terminals coupled to circuit modules 301a and 301b, respectively. Transistors 410a and 410b form amplifier input differential pairs and are used with current source 412 for an inductive peaking amplifier.

For increased reliability, in some embodiments NMOS transistors of circuit modules 301a, 301b are provided as I/O (input/output) devices rather than core devices. Typically, a foundry provides core devices and I/O devices, which are two different types of semiconductor devices. Core devices and I/O devices are described at, e.g., U.S. Pat. No. 7,868,361 to Cheng et al. the entirety of which is herein incorporated by reference. Core devices typically include a high-k gate dielectric. I/O devices, which are designed to handle higher voltages than core devices, do not include a high-k gate dielectric. The threshold voltage of an I/O device is higher (e.g., 1.8 V) than the threshold voltage of a core device (e.g., 1.2 V). In some embodiments, core voltage devices are used for PMOS transistors 304a and 304b, and I/O devices are used for NMOS transistors 306a and 306b. With the resistance calibration approach of various embodiments, the gate voltage of the NMOS transistors will be higher than the core voltage, so using I/O devices for these NMOS transistors (i.e., using IO-NMOS transistors) prevents damage to the transistors and ensures reliability, e.g., when the threshold voltage exceeds 1.2 V.

Figure 5:
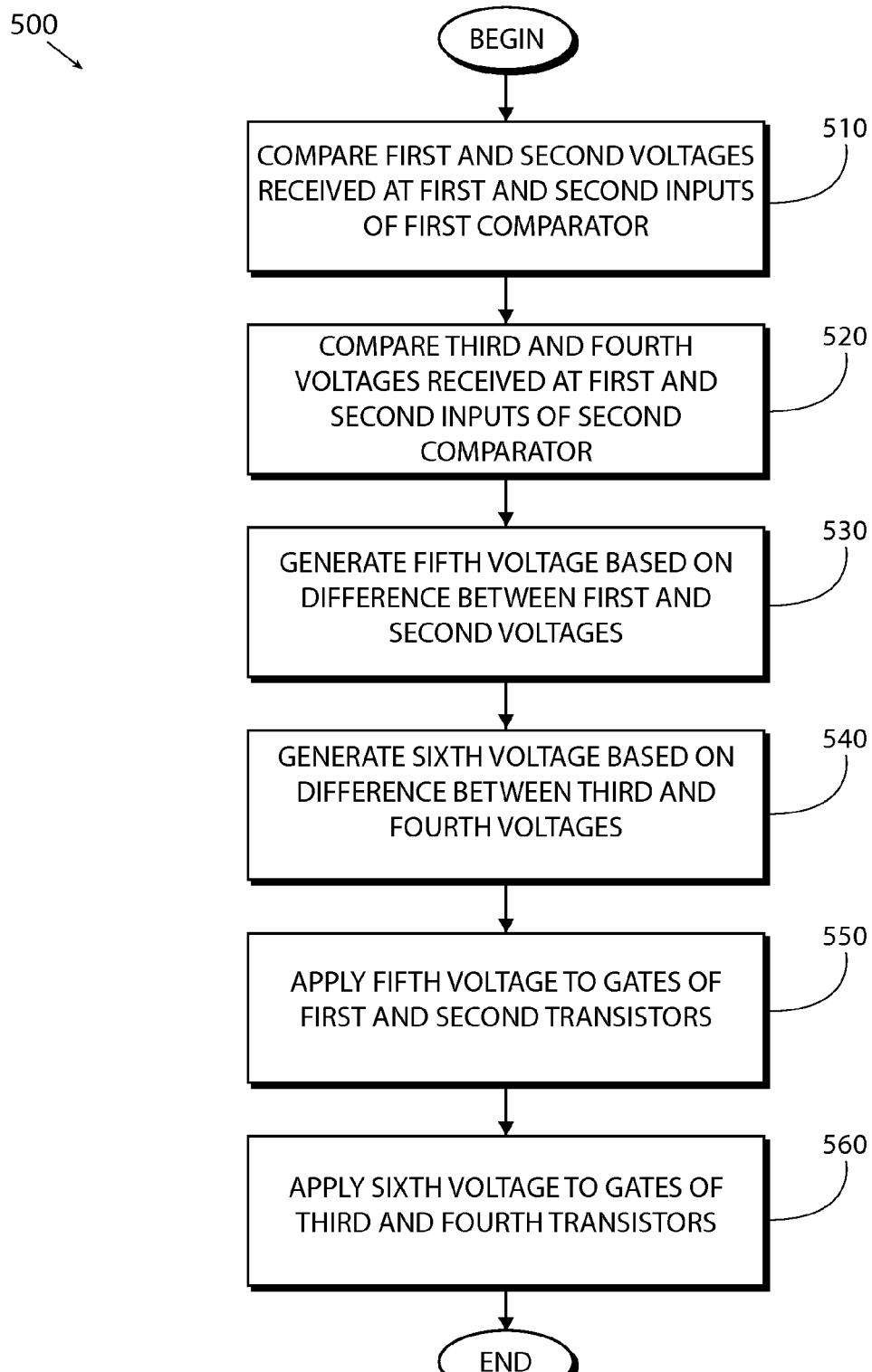
FIG. 5 is a flow diagram in accordance with some embodiments.

FIG. 5 is a flow diagram of a process in accordance with some embodiments. After process 500 begins, a first voltage received at a first input (e.g., a noninverting input) of a first comparator (e.g., comparator 320a) is compared (block 510) to a second voltage received at a second input (e.g., an inverting input) of the first comparator. A third voltage received at a first input (e.g., a noninverting input) of a second comparator (e.g., comparator 320b) is compared (block 520) to a fourth voltage received at a second input (e.g., an inverting input) of the second comparator. A fifth voltage (e.g., $V_{bp}$) is generated (block 530) based on a difference between the first and second voltages, and a sixth voltage (e.g., $V_{bn}$) is generated (block 540) based on a difference between the third and fourth voltages. The fifth voltage is applied (block 550) to gates of first and second transistors (e.g., transistors 304a and 304b), respectively, of a first type (e.g., the first and transistors may be PMOS transistors). The first transistor is coupled in parallel with a first resistor (e.g., resistor 302a) and a third transistor of a second type (e.g., NMOS transistor 306a). The second transistor is coupled in parallel with a second resistor (e.g., resistor 302b) and a fourth transistor of the second type (e.g., NMOS transistor 306b). The sixth voltage is applied (block 560) to gates of the third and fourth transistors, respectively.

In some embodiments, a circuit has a first circuit module (e.g., circuit module 301a) including a first resistor (e.g., resistor 302a) and first and second transistors (e.g., resistors 304a and 306a, respectively) coupled in parallel with the first resistor. The first resistor and the first and second transistors are coupled together at a first node (e.g., node 422a). An equivalent resistance across the first circuit module increases as a voltage of the first node is increased from a first voltage to a second voltage, and the equivalent resistance across the first circuit module decreases as the voltage of the first node is increased from the second voltage to a third voltage.

In some embodiments, a circuit includes first and second circuit modules (e.g., circuit modules 301a and 301b, respectively), first and second nodes (e.g., nodes 312 and 310, respectively), and first and second operational amplifiers (e.g., amplifiers 320a and 320b, respectively). The first and second circuit modules are coupled to a power supply voltage (e.g., $V_{PS}$). The first and second nodes each couple the first and second circuit modules. The first and second operational amplifiers have respective outputs coupled to the first and second nodes, respectively. Each circuit module includes at least two transistors coupled in parallel with a resistor.

In some embodiments, a first voltage received at a first input (e.g., a noninverting input) of a first comparator (e.g., comparator 320a) is compared to a second voltage received at a second input (e.g., an inverting input) of the first comparator. A third voltage received at a first input (e.g., a noninverting input) of a second comparator is compared to a fourth voltage received at a second input (e.g., an inverting input) of the second comparator. A fifth voltage (e.g., $V_{bp}$) is generated based on a difference between the first and second voltages, and a sixth voltage (e.g., $V_{bn}$) is generated based on a difference between the third and fourth voltages. The fifth voltage is applied to gates of first and second transistors (e.g., transistors 304a and 304b), respectively, of a first type (e.g., the first and transistors may be PMOS transistors). The first transistor is coupled in parallel with a first resistor (e.g., resistor 302a) and a third transistor of a second type (e.g., NMOS transistor 306a). The second transistor is coupled in parallel with a second resistor (e.g., resistor 302b) and a fourth transistor of the second type (e.g., NMOS transistor 306b). The sixth voltage is applied to gates of the third and fourth transistors, respectively.

Although examples are illustrated and described herein, embodiments are nevertheless not limited to the details shown, since various modifications and structural changes may be made therein by those of ordinary skill within the scope and range of equivalents of the claims.

What is claimed is:

1. A circuit comprising:
  a first circuit module including a first resistor and first and second transistors coupled in parallel with said first resistor, wherein the first resistor and the first and second transistors are coupled together at a first node, and a gate voltage of the second transistor is based on a comparison between a reference voltage and a voltage of the first node; and
  a second circuit module including a second resistor and third and fourth transistors coupled in parallel with the second resistor, wherein the second resistor and the third and fourth transistors are coupled together at a second node;
  wherein an equivalent resistance across the first circuit module increases as a voltage of the first node is increased from a first voltage to a second voltage, and the equivalent resistance across the first circuit module decreases as the voltage of the first node is increased from the second voltage to a third voltage;
  wherein an equivalent resistance across the second circuit module increases as a voltage of the second node is increased from the first voltage to the second voltage, and the equivalent resistance across the second circuit module decreases as the voltage of the second node is increased from the second voltage to the third voltage.

2. The circuit of claim 1, wherein the first and second transistors are an NMOS transistor and a PMOS transistor, respectively.

3. The circuit of claim 1, wherein a gate of the first transistor is coupled to a gate of the third transistor, and a gate of the second transistor is coupled to a gate of the fourth transistor.

4. The circuit of claim 1, wherein the first and third transistors are NMOS transistors, and the second and fourth transistors are PMOS transistors.

5. The circuit of claim 1, wherein the second transistor is a core device comprising a high-k gate dielectric, and the first transistor is an I/O (input/output) device, wherein the I/O device does not include a high-k gate dielectric, and wherein a threshold voltage of the I/O device is higher than a threshold voltage of the core device.

6. The circuit of claim 5, wherein the first transistor is an NMOS transistor, and the second transistor is a PMOS transistor.

7. The circuit of claim 1, further comprising:
  a fifth transistor having a drain coupled to the first node; and
  a sixth transistor having a drain coupled to a second node, and a source coupled to a source of the fifth transistor.

8. A circuit comprising:
  a first circuit module coupled to a power supply voltage;
  a second circuit module coupled to the power supply voltage;
  a first node coupling the first and second circuit modules;
  a second node coupling the first and second circuit modules;
  a first operational amplifier having an output coupled to the first node; and
  a second operational amplifier having an output coupled to the second node;
  wherein each circuit module includes at least two transistors coupled in parallel with a resistor.

9. The circuit of claim 8, wherein at least one transistor in each circuit module is an NMOS transistor, and at least one transistor in each circuit module is a PMOS transistor.

10. The circuit of claim 9, wherein said PMOS transistor of the first circuit module is coupled to said PMOS transistor of the second circuit module by the first node, and said NMOS transistor of the first circuit module is coupled to said NMOS transistor of the second circuit module by the second node.

11. The circuit of claim 10, wherein respective gates of the PMOS transistors of the first and second circuit modules are coupled together, and respective gates of the NMOS transistors of the first and second circuit modules are coupled together.

12. The circuit of claim 8, wherein the first operational amplifier has a first input coupled to the first circuit module, and a second input coupled to a first voltage, and the second operational amplifier has a first input coupled to the second circuit module, and a second input coupled to a second voltage.

13. The circuit of claim 12, wherein the first and second inputs of the first operational amplifier are an inverting input and a non-inverting input, respectively, and the first and second inputs of the second operational amplifier are a non-inverting input and an inverting input, respectively.

14. The circuit of claim 12, further comprising first and second current mirrors, wherein said first current mirror is coupled to the first circuit module and to the first operational amplifier, and the second current mirror is coupled to the second circuit module and to the second operational amplifier.

15. The circuit of claim 14, further comprising first and second current sources coupled to the first and second current mirrors, respectively, wherein the first and second current sources, the first and second voltages, and the power supply voltage satisfy $(V_{PS}-V_1)/I_1 = (V_{PS}-V_2)/I_2$, wherein $V_{PS}$ is the power supply voltage, $V_1$ is the first voltage, $V_2$ is the second voltage, $I_1$ is the current provided by the first current source, and $I_2$ is the current provided by the second current source.

16. The circuit of claim 8, wherein one of the transistors of each of the first and second circuit modules is a core device comprising a high-k gate dielectric; and one of the transistors of each of the first and second circuit modules is an I/O (input/output) device, wherein said I/O device does not include a high-k gate dielectric, and a threshold voltage of said I/O device is higher than a threshold voltage of said core device.

17. The circuit of claim 16, wherein the core device of each circuit module is a PMOS transistor, and the I/O device of each circuit module is an NMOS transistor.

18. A method comprising:
comparing a first voltage received at a first input of a first comparator to a second voltage received at a second input of the first comparator;
comparing a third voltage received at a first input of a second comparator to a fourth voltage received at a second input of the second comparator;
generating a fifth voltage based on a difference between the first and second voltages;
generating a sixth voltage based on a difference between the third and fourth voltages;
applying the fifth voltage to gates of first and second transistors, respectively, of a first type, the first transistor being coupled in parallel with a first resistor and a third transistor of a second type, the second transistor being coupled in parallel with a second resistor and a fourth transistor of the second type; and
applying the sixth voltage to gates of the third and fourth transistors, respectively.

19. The method of claim 18, further comprising:
generating a first current at a first current source coupled to a first current mirror; and
generating a second current at a second current source coupled to a second current mirror;
wherein the second input of the first comparator is coupled to the first current mirror, and the first input of the second comparator is coupled to the second current mirror;
wherein the first and second currents and the first and fourth voltages satisfy $(V_{PS}-V_1)/I_1=(V_{PS}-V_2)/I_2$, wherein Vps is a power supply voltage coupled to the transistors and to the resistors, $V_1$ is the first voltage, $V_2$ is the fourth voltage, $I_1$ is the first current, and $I_2$ is the second current.

* * * * *